United States Patent [19]

Lindsay

[11] Patent Number: 5,313,552
[45] Date of Patent: May 17, 1994

[54] APPARATUS FOR QUANTIZING AN INPUT GROUP OF DATA SAMPLES INTO ONE OF N QUANTIZED GROUPS OF DATA VIA A PROCESS ON LESS THAN N/2 REFERENCE GROUPS OF DATA SAMPLES

[75] Inventor: Robert A. Lindsay, Bountiful, Utah
[73] Assignee: Unisys Corporation, Blue Bell, Pa.
[21] Appl. No.: 31,076
[22] Filed: Mar. 11, 1993

Related U.S. Application Data

[63] Continuation of Ser. No. 676,903, Mar. 27, 1991, abandoned.

[51] Int. Cl.$^5$ .............................................. G10L 9/04
[52] U.S. Cl. ................................................. 395/2.13
[58] Field of Search ...................... 382/11; 381/29–43; 395/2.13

[56] References Cited

U.S. PATENT DOCUMENTS

| | | | |
|---|---|---|---|
| 4,907,276 | 3/1990 | Aldersberg | 381/35 |
| 4,972,483 | 11/1990 | Carey | 381/31 |
| 5,021,971 | 6/1991 | Lindsay | 381/35 |
| 5,054,073 | 10/1991 | Yazu | 381/37 |

Primary Examiner—Michael R. Fleming
Assistant Examiner—Michelle Doerrler
Attorney, Agent, or Firm—Charles J. Fassbender; Mark T. Starr

[57] ABSTRACT

A quantizer, which converts an input group of data samples into one of N quantized groups of data samples, does so by performing several dot products and compares. Each dot product is between the input group of data samples and a reference group of data samples $\bar{u}_x$, and each compare is with the dot product result and a constant $k_y$. All of the reference groups of data samples and all of the constants are stored in a memory. This memory holds only N-1 constants and less then N/2 reference groups of data samples. A memory saving of several thousand percent is achieved by limiting the memory to hold no more then 2r reference groups of data samples where r is the number of samples in the input group, or no more then 2 log$_2$ N reference groups of data samples.

22 Claims, 8 Drawing Sheets

APPARATUS FOR QUANTIZING AN INPUT GROUP OF DATA SAMPLES INTO ONE OF N QUANTIZED GROUPS OF DATA VIA A PROCESS ON LESS THAN N/2 REFERENCE GROUPS OF DATA SAMPLES

This is a continuation of co-pending application Ser. No. 07/676,903 filed on Mar. 27, 1991, now abandoned.

BACKGROUND OF THE INVENTION

This invention relates to apparatus for quantizing input groups of data samples, and to processes which such apparatus carry out.

In the prior art, various apparatus which quantize input groups of data samples have been developed to meet the need to compress the samples and thereby reduce the amount of memory which it takes to store the samples and/or reduce the transmission rate which it takes to transmit the samples. Typically, the input data samples are quantized in groups of 2 to 32 samples. Also, each data sample in the group consists of a certain number of bits such as 8 bits. Thus, as the number of data samples per group increases, and the number of bits per data sample increases, the total number of permutations of the bits in each data sample group becomes very large.

During a quantization process, several different bit permutations which are "close" to each other are all transformed to a single permutation. This single permutation constitutes one quantized group of data samples. By limiting the total number of quantized groups of data samples, the desired data compression occurs. For example, an input group of data samples which has several million bit permutations might be quantized into one of just several thousand quantized groups of data samples.

In order to quantize an input group of data samples, many operations need to be preformed by the quantizing apparatus. These operations vary in their degree of complexity with the particular process that the quantizing apparatus performs. Also, to perform the above operations, the quantizing apparatus needs to access from some type of storage module, a description or definition of all of the quantized data sample groups. This storage module varies in its storage capacity with the particular process that is being carried out.

For the quantizing process to occur quickly, the complexity of the operations that need to be performed must be low. Also, for the quantizing apparatus to be economically feasible, the size of the storage module which it uses to store the definition of all of the quantized groups of data samples must be small.

Accordingly, a primary object of the invention is to provide a novel apparatus and process for quantizing input groups of data samples which require substantially less storage capacity and/or fewer operations then the prior art.

BRIEF SUMMARY OF THE INVENTION

One preferred embodiment of the invention is an apparatus which transforms an input group of data samples into one of N quantized group of samples by means of a storage module, a control module, an arithmetic module, a compare module, and a set of flip-flops. Stored in the storage module are N-1 constants and substantially fewer reference groups of data samples. In operation, the control module sends an address to the storage module which reads out one of the reference groups of data samples $\bar{u}_x$ and one of the constants $k_y$. Then, the arithmetic module performs a dot product on the input group of data samples with $\bar{u}_x$, and the compare module compares the dot product result to the constant $k_y$. If the dot product result is greater then the constant $k_y$, then one of the flip-flops is set, otherwise it is reset. Thereafter, the control module repeatedly selects a different $\bar{u}_x$ and different $k_y$ for the arithmetic module and the compare module, and each $\bar{u}_x$ and $k_y$ is selected as a function of all preceding compares from a compare module. Results of each compare are respectively stored in one of the flip-flops, and the state of all of the flip-flops identifies the one quantized group of data samples into which the input group of data samples is transformed.

With the above apparatus, the storage capacity of the storage module is reduced by several thousand percent over prior art quantizers. This is achieved by limiting the total number of reference groups of data samples in the storage module to no more then $2 \log_2 N$. Alternatively, the above memory savings is achieved by limiting the total number of reference groups of data samples in the storage module to no more then $2r$ where r is the number of samples in each input group of data samples.

BRIEF DESCRIPTION OF THE DRAWINGS

Various preferred processes for quantizing input groups of data samples according to the invention, as well as apparatus for performing those processes, are described herein in conjunction with the accompanying drawings wherein.

FIG's. 4a-4c illustrate one preferred process by which an arbitrary input group of data samples $V_i$ is quantized into one of the regions of FIG. 2.

DETAILED DESCRIPTION

Figure 1:
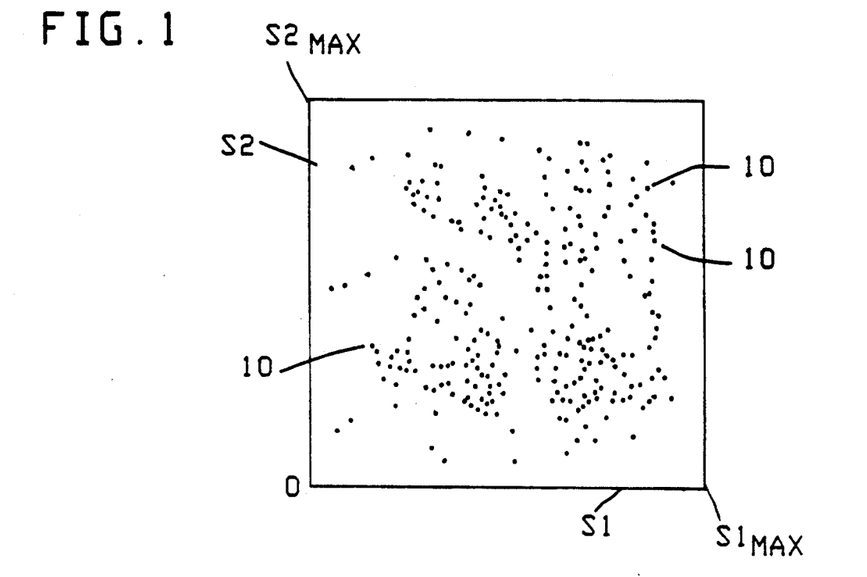
FIG. 1 shows an example of the input groups of data samples that are to be quantized in which each group contains two samples.

Referring now to the figures, various preferred processes for quantizing input groups of data samples according to the invention, as well as various preferred circuits for carrying out those processes, will be described in detail. For the sake of clarity, this description begins with a simple case wherein each input group of data samples contains just two samples S1 and S2. This case is illustrated in FIG. 1 in which each of the dots 10 identifies a particular input group of one S1 data sample and one S2 data sample. The magnitudes of the S1 data samples are given on the S1 axis; and the magnitudes of the S2 data samples are given on the S2 axis. By comparison, in the general case, each input group of data samples has any number of samples. For example, each group could be a 4×4 group of sixteen samples extracted from an image array.

Each of the data samples in FIG. 1 is acquired by sampling an electrical output signal from a sensor. This sensor can for example be one which senses radar return pulses, or optical images, or infrared images, or audio signals. All of the samples from the sensor are converted to a digital form in which they are each represented by a predetermined number of bits, such as 8 bits.

These digital samples are then grouped in the S1, S2 pairs in some predetermined fashion. For example, the S1, S2 samples of one group may respectively be the first and second samples taken from the sensor; the S1, S2 samples of the another group may respectively be the third and forth samples taken; etc. Alternatively, each of the S1 samples may be from one type of sensor such as an optical image sensor, and each of the S2 samples may be from another type of sensor. This acquiring and grouping of the data samples in FIG. 1 continues until their overall distribution is representative of the particular sensor output signal(s) that is (are) being sampled.

Figure 2:
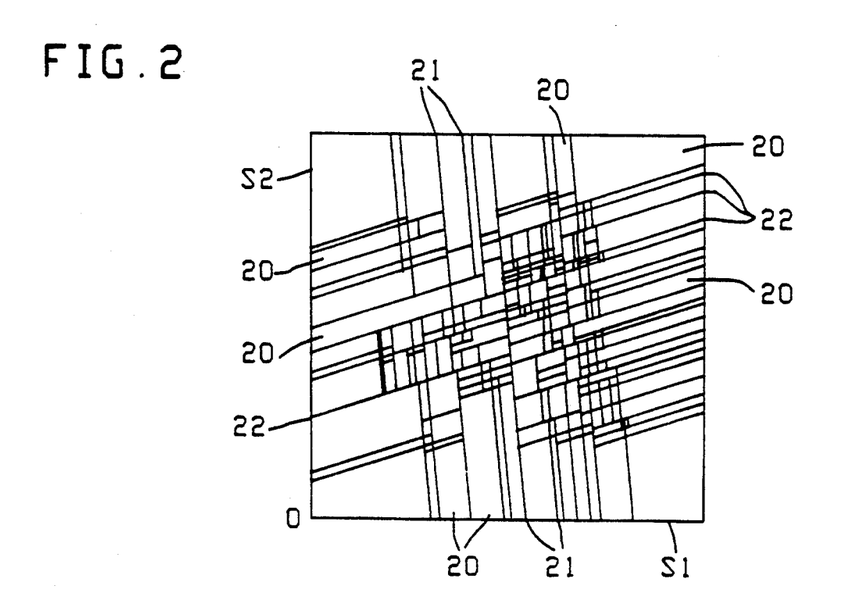
FIG. 2 illustrates various regions into which the FIG. 1 input groups of data samples are divided by the presently disclosed quantization process.

Next, as is shown in FIG. 2, the data sample groups of FIG. 1 are divided into a plurality of N regions 20. Then, all of the data sample groups of each particular region are quantized to the centroid (average value) of that region. In other words, the centroids constitute N quantized groups of data samples to which all input groups of data samples are transformed.

All of the regions 20 have various sizes and shapes as shown; and, in accordance with the inventions, the regions 20 are characterized as having only two types of boundaries 21 and 22. The boundaries 21 are oriented in a first direction and are parallel to each other, and the boundaries 22 are oriented in a second direction and are parallel to each other.

To divide the FIG. 1 data sample groups 10 into the various regions 20, an iterative process is used which is illustrated in FIG's 3A-3D. This process begins by selecting a first boundary 21-1 which divides all of the FIG. 1 data sample groups 10 into just two regions 20-1 and 20-2. Those data sample groups which lie in the region 20-1 have a centroid 20-1c, and those data sample groups which lie in the region 20-2 have a centroid 20-2c.

Figure 3A:
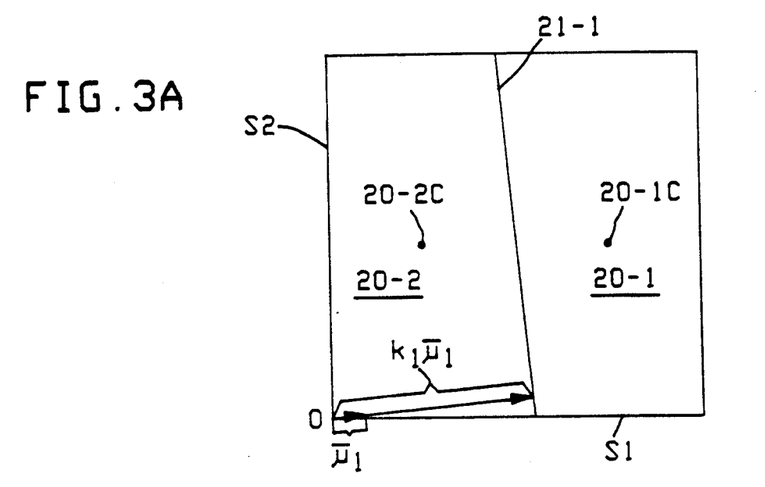
FIG. 3A-3D illustrate a sequence of steps by which the regions of FIG. 2 are obtained.

If all of the data sample groups in region 20-1 were quantized to the centroid 20-1c, a certain amount of distortion D1 would occur. This distortion D1 is proportional to the sum of the squares of the respective distances of all of the data sample groups 20 in region 20-1 to the centroid 20-1c. Similarly, if all of the sampled data groups in the region 20-2 are quantized to the centroid 20-2c, the resulting distortion D2 is proportional to the sum of the squares of the respective distances of all region 20-2 data sample groups to the centroid 20-2c. These distortions D1 and D2 vary with the location and angular orientation of the boundary 21-1. To reduce this distortion, the boundary 21-1 is positioned at various locations and with various orientations until the sum of the distortions D1 and D2 reaches some acceptable level.

Once the final position of the boundary 21-1 is determined, its angular orientation is specified by a first reference group of data samples $\bar{u}_1$. As used herein and as shown in FIG. 3A, the first reference group of data samples $\bar{u}_1$ is defined as a vector from the origin which is orthogonal to the boundary 21-1 and has unit magnitude. Also, the location of the boundary 21-1 is specified as a constant $k_1$ by which $\bar{u}_1$ must be multiplied to reach the boundary 21-1.

Figure 3B:
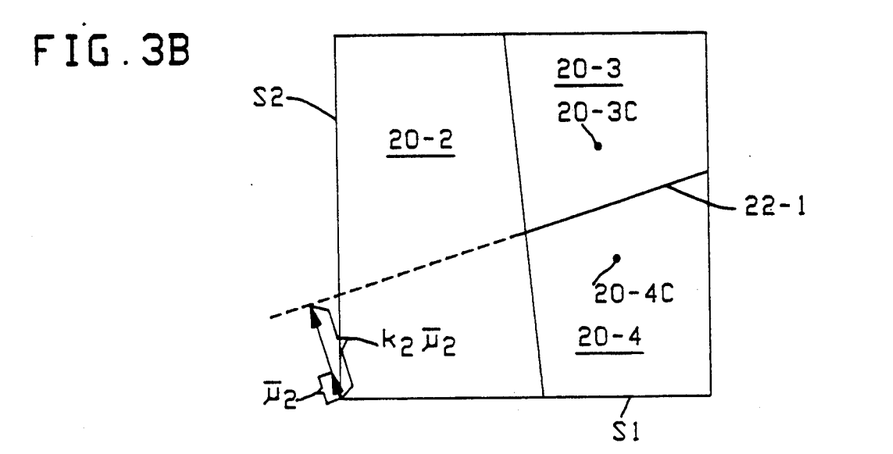

Next, as shown in FIG. 3B, region 20-1 is divided by a boundary 22-1 into two regions 20-3 and 20-4. All of the data sample groups in region 20-3 have a centroid 20-3c, and all of the data samples groups in region 20-4 have a centroid 20-4c. When the groups of data samples in region 20-3 are quantized to the centroid 20-3c, the resulting distortion D3 is proportional to the sum of the squares of the respective distances of all region 20-3 data sample groups to the centroid 20-3c. Similarly, when the groups of data samples in region 20-4 are quantized to the centroid 20-4c, the resulting distortion is D4 is proportional to the sum of the square of the respective distances of all region 20-4 data sample groups to the centroid 20-4c. Here again, to reduce distortion the boundary 22-1 is positioned at various locations and with various orientations until the sum of the distortions D3 and D4 reaches an acceptable level.

Once the final position of boundary 22-1 is determined, its orientation is specified by the second reference group of data samples $\bar{u}_2$. As used herein and as shown in FIG. 3B, the second reference group of data samples $\bar{u}_2$ is defined as a vector from the origin which is orthogonal to the boundary 22-1 and has unit magnitude. Also, the location of boundary 22-1 is specified as a constant $k_2$ by which $\bar{u}_2$ must be multiplied to reach the boundary 22-1.

Thereafter, each of the regions 20-2, 20-3, and 20-4 in FIG. 3B are divided in two; then the resulting regions are further divided in two; etc. This process continues until all of the regions 20 of FIG. 2 are obtained. During these dividing steps, the boundaries 21 and 22 which are used to divide the regions are restricted in their orientations to be parallel to the boundaries 21-1 and 22-1. In other words, all of the boundaries 21 are restricted to be orthogonal to $\bar{u}_1$, and all of the boundaries 22 are restricted to be orthogonal to $\bar{u}_2$.

Figure 3C:
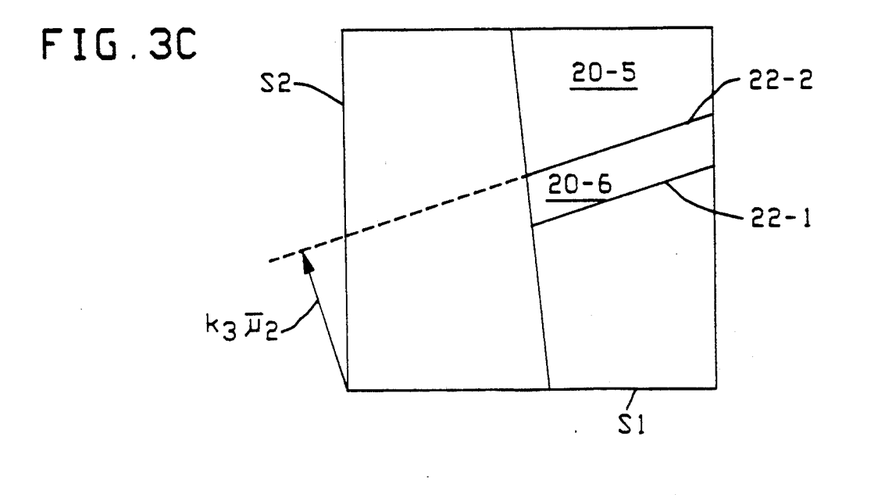
Figure 3D:
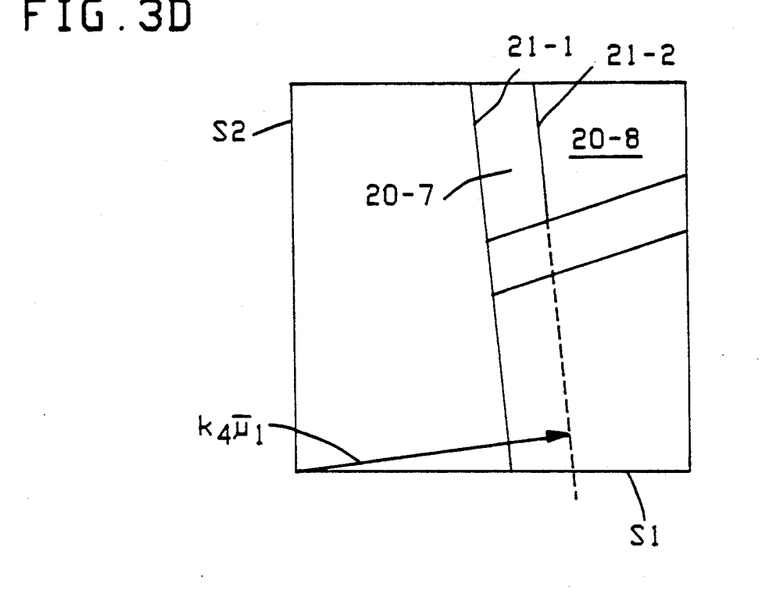

This dividing of the groups of data samples into regions having restricted boundaries is illustrated in FIG's 3C and 3D. In FIG. 3C, region 20-3 is divided into regions 20-5 and 20-6 by a boundary 22-2 which is orthogonal to $\bar{u}_2$. Boundary 22-2 has a location and orientation which is completely defined by $k_3 \bar{u}_2$. In FIG. 3D, region 20-5 is subdivided into two regions 20-7 and 20-8 by a boundary 21-2 which is orthogonal to $\bar{u}_1$. Boundary 21-2 is completely defined by $k_4 \bar{u}_1$.

To form all N of the regions 20 in FIG. 2, a total of N-1 boundaries 21 and 22 are required. And, the location and orientation of each of those N-1 boundary is completely defined by a respective constant $k_i$ times either $\bar{u}_1$ or $\bar{u}_2$. Thus, a complete definition of the FIG. 2 regions can be stored in a digital memory by storing the N-1 constants $k_i$ and by storing just two reference groups of data samples $\bar{u}_1$ and $\bar{u}_2$.

Figure 4A:
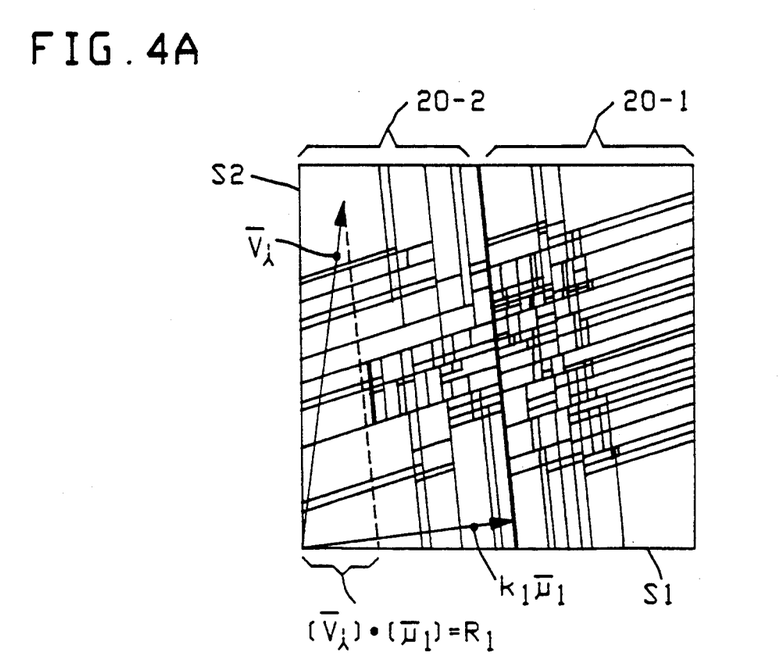

Following the above described steps, any arbitrary input group of data samples $V_i$ can be quantized to the centroid of one of the N regions of FIG. 2 by a process which is illustrated in FIG's. 4A thru 4C. As a first step of this process, a dot product is taken between the input group of data samples $V_i$ and $\bar{u}_1$. By a dot product is herein meant the $S_1$ sample in $V_i$ times the $S_1$ sample in $\bar{u}_1$, plus the $S_2$ sample in $V_i$ times the $S_2$ sample in $\bar{u}_1$. This dot product operation produces a result $R_1$ which is shown in FIG. 4A. Next, the result $R_1$ is compared to the constant $k_1$. If the result $R_1$ is larger then $k_1$, then the input group of data samples $V_i$ lies in region 20-1; otherwise the input group of data samples $V_i$ lies in region 20-2.

Figure 4B:
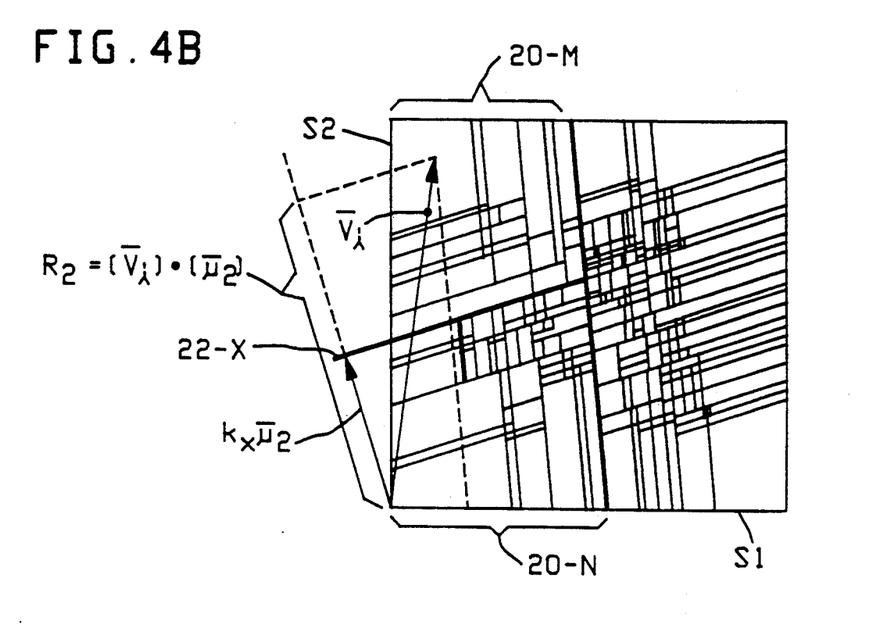

In FIG. 4A, the input group of data samples $V_i$ lies in region 20-2; and in FIG. 4B, region 20-2 is divided in two by a boundary 22-x. Thus, the next step of the process is to determine on which side of the boundary 22-x the input group of data samples $V_i$ lies. Boundary 22-x is defined by $k_x \bar{u}_2$. So to make the above determination, the dot product is taken between the input group of data samples $V_i$ and $\bar{u}_2$. This produces a result $R_2$ as shown in FIG. 4B. Then, the result $R_2$ is compared with the constant $k_x$. If $R_2$ is greater then the constant $k_x$, then the input group of data samples lies in region 20-M; otherwise it lies in region 20-N.

Figure 4C:
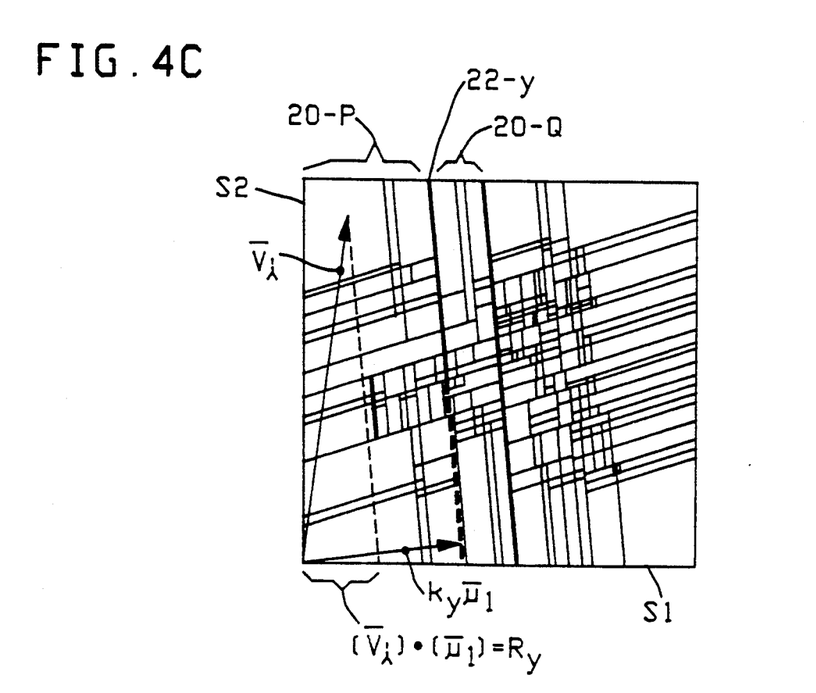

Inspection of FIG. 4B shows that the input group of data samples $V_i$ lies in region 20-M. Further, FIG. 4C shows that region 20-M is divided by a boundary 22-Y into two regions 20-P and 20-Q. Boundary 22-Y is defined by $k_y \bar{u}_1$. Thus, to determine whether the input group of data samples $V_i$ lies in the region 20-P or 20-Q, a dot product operation is performed between $V_i$ and $\bar{u}_1$. If the result $R_y$ of that dot product is less then the constant $k_y$, then the input group of data samples $V_i$ lies in the region 20-P; otherwise $V_i$ lies in the region 20-Q.

By continuing the above described dot product and compare steps, the particular one of the N regions in which the input vector $V_i$ lies will be determined. When that occurs, the input group of data samples $V_i$ is quantized to the centroid of the data samples in that region.

Figure 5:
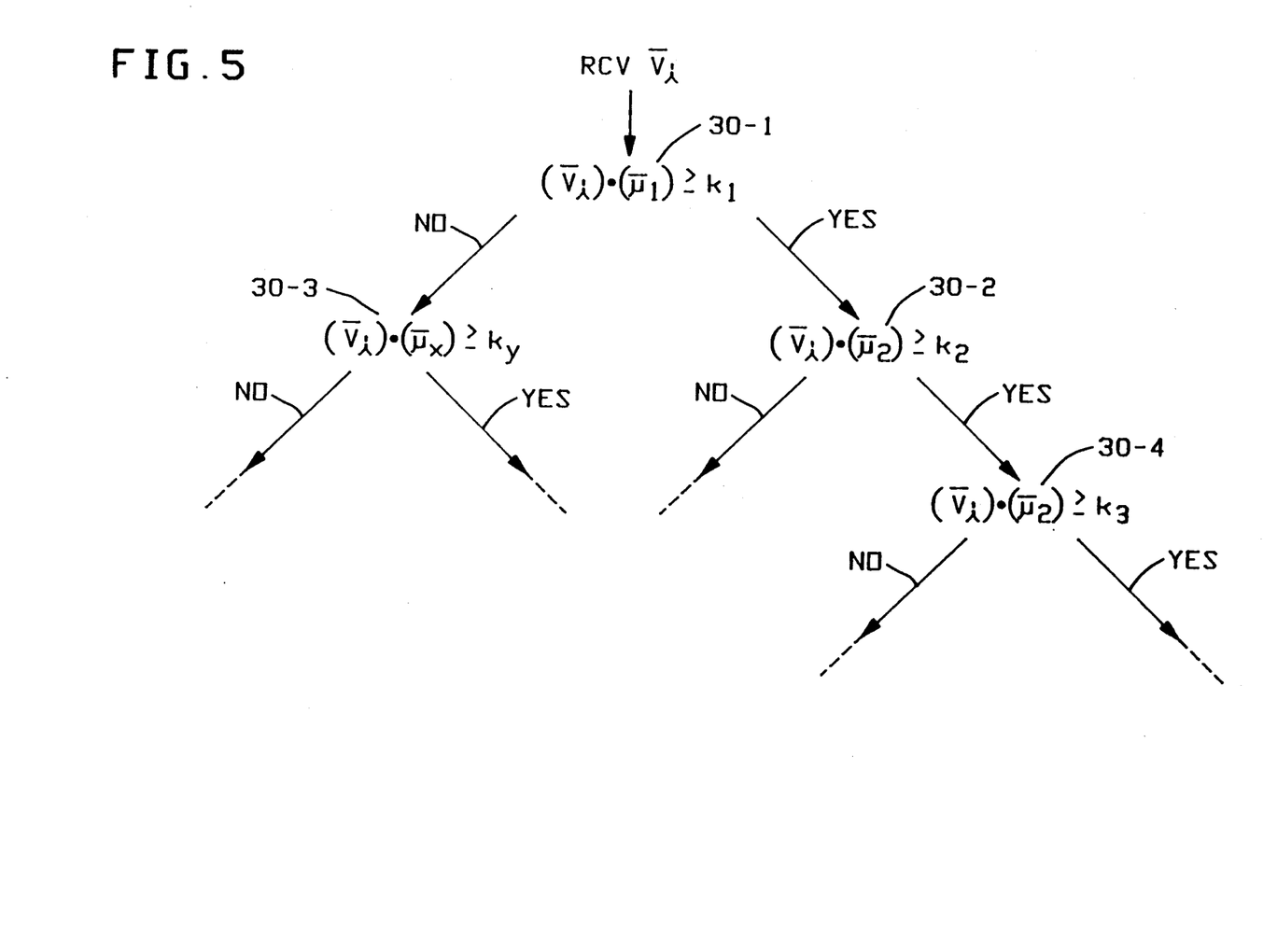
FIG. 5 is a flow chart which further explains the quantization process of FIG's. 4a-4c.

Turning now to FIG. 5, it shows the above described quantizing process in a flow chart form. This flow chart has the shape of a tree in which there are multiple nodes 30-1, 30-2, 30-3, etc., and there are two branches "Yes" and "No" from each node. At each node, a dot product is taken between the input group of data samples $V_i$ and either $\bar{u}_1$ or $\bar{u}_2$. Then the result of that dot product is compared with one of the constants $k_i$. If the dot product result is greater then or equal to $k_i$, then the "Yes" branch is taken from the node; otherwise the "No" branch is taken.

In the FIG. 5 flow charts, the particular $\bar{u}$ and particular k that occurs at each node is determined by the previously described process steps of FIG's. 3A-3D. Thus, the k and $\bar{u}$ of the top most node 30-1 correspond to $k_1$ and $\bar{u}_1$ in FIG. 3A; the k and $\bar{u}$ in node 30-2 correspond to $k_2$ and $\bar{u}_2$ in FIG. 3B; the k and $\bar{u}$ at node 30-4 corresponds to the $k_3$ and $\bar{u}_2$ in FIG. 3C; etc.

By traversing a series of nodes in the FIG. 5 tree starting with the top node 30-1 and continuing to one of the end branches of the tree, the particular region in which the input group of data samples lies is determined. If the tree is symmetrical, it will have N end branches and N will be the nth power of two (i.e. $-N=2^n$). In that case, the total number of nodes which needs to be traversed is "n"; and, to traverse the tree from the top node 30-1 to an end branch will require a total of "n" dot products and "n" compares.

Figure 6:
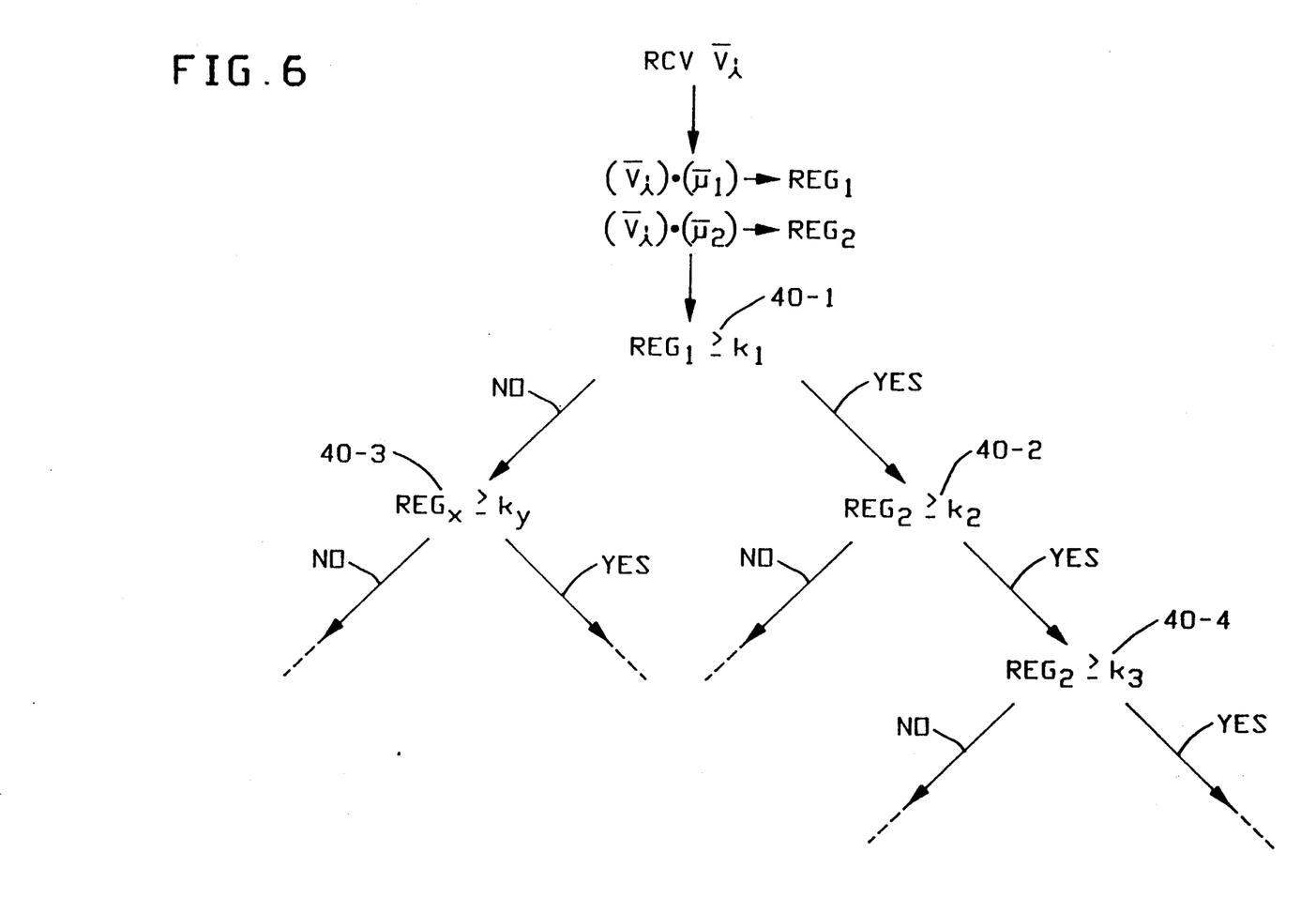
FIG. 6 is a flow chart which illustrates another preferred quantization process as an alternative to the FIG. 5 process.

As an alterative, the FIG. 5 quantizing process can be modified as shown by the flow chart the FIG. 6. This FIG. 6 flow chart has a shape of a tree in which there are multiple nodes 40-1, 40-2, 40-3, etc., and there are two branches Yes and No from each node. However, the FIG. 6 tree differs from the FIG. 5 tree in that prior to entering the top most node 40-1, respective dot products on the input group of data samples $V_i$ are made with the reference groups of data samples $\bar{u}_1$ and $\bar{u}_2$ and, the results of those dot products are stored in respective registers $REG_1$ and $REG_2$. Thereafter, at each node of the tree which is traversed, one of the registers $REG_1$ or $REG_2$ is merely compared with a particular one of the constants $k_i$; and, a branch is taken based on the result of that compare.

Both the FIG. 5 process and the FIG. 6 process can readily be adapted to quantize an input group of data samples $V_i$ in cases where there are more then two samples per group, and cases where more then two reference groups of data samples are used to define the boundaries between the regions 20. In the general case, let "r" be the number of data samples per group, and let "s" be the number of reference groups of data samples which define the boundaries between the regions 20. Then in FIG. 5, the reference group of data samples at each node will be $\bar{u}_x$ is selected from the set $\bar{u}_1, \bar{u}_2, \ldots \bar{u}_s$ and, the dot product with $\bar{u}_x$, is defined as: the first sample in $V_i$ times the first sample in $\bar{u}_x$, plus the second sample in $V_i$ times the second sample in $\bar{u}_x$, plus . . . the last sample in $V_i$ times the last sample in $\bar{u}_x$.

Likewise, to generalize the FIG. 6 process, respective dot products on the input group of data samples $V_i$ are made with all of the reference groups of data samples $\bar{u}_1$ thru $\bar{u}_s$; and the results of those dot products are stored in respective registers $REG_1$ thru $REG_s$. Those dot product steps occur prior to entering the top most node 40-1. Thereafter, the nodes of the tree are traversed to an end branch; and at each node one of the REG's is compared to one of the constants $k_i$.

A primary feature of the generalized FIG. 6 process is that it minimizes the number of dot products which are made when the number of nodes that need to be traversed in going from the top most node to an end branch is larger then the number of reference groups of data samples. For a symmetrical tree, the FIG. 6 process minimizes the number of dot product when "n" is larger then "s". By comparison, the generalized FIG. 5 process minimizes the number of dot products when the number of nodes which need to be traversed in going from the top most node to an end branch is less then the number of reference groups of data samples.

Another primary feature of both the FIG. 5 process and the FIG. 6 process is that the amount of memory which those processes require to store all of the constants $k_i$ and all of the reference groups of data samples $\bar{u}_1$ thru $\bar{u}_s$ is small. To store all of the constants $k_i$ requires enough memory to hold N-1 scalars; and, to store all of the reference groups of data samples requires enough memory to hold "s" times "r" scalars.

One preferred way to limit "s" (the total number of reference groups of data samples) and thus reduce memory, is to restrict "s" to be no more then $2 \log_2 N$. Another alternative way to limit "s" is to restrict it to be no more then 2r. These constraints reduce memory by several thousand percent over that which would be used if "s" was unrestricted and thus equal to "N-1". At the same time, any increase in distortion that results from the above constraints on "s" has been found by computer simulation to be less then 5% and thus insignificant for values of N of $2^{10}$ or more. Further, any increase in distortion can be completely eliminated by simply increasing N.

As indicated above, if the boundaries of the quantizing regions 20 were not restricted in their orientations, then at each node in FIG. 5 and FIG. 6, there would be a different reference group of data samples $\bar{u}_i$ where i ranges from 1 to N-1. In that case, to store all of reference groups of data samples would require enough memory to hold "N-1" times "r" scalars. This increase in memory is very substantial since "N-1", the number of nodes in the tree, is preferably several thousand in order to reduce distortion.

As a practical numerical example of the above memory savings, suppose the FIG. 5 tree or FIG. 6 tree is symmetrical and its total number of end branches N is $2^{16}$ or 65,536. Suppose further that each input group of data samples is a $4 \times 4$ group of sixteen pixels from an image array, and that sixteen reference groups of data samples are used to define the N regions into which input groups of data samples are to be quantized. In other words, in this example, N=65,536 and r=s=16. Then, to store the reference groups of data samples for the FIG. 5 or FIG. 6 process will require enough memory to hold just 16 times 16 scalars; whereas if the boundaries of the quantizing regions are not restricted, the memory will be required to hold 65,535 times 16 scalars!

Figure 7:
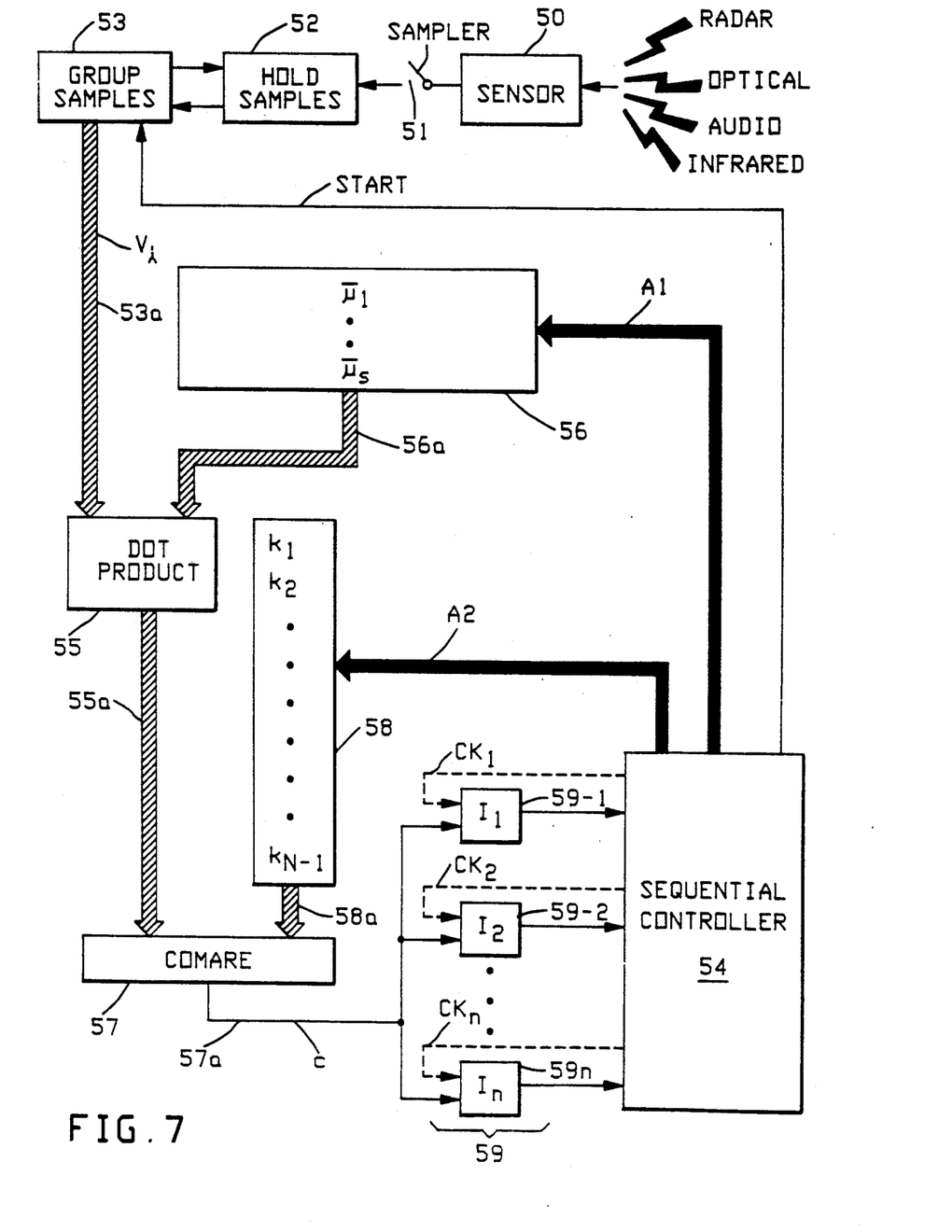
FIG. 7 illustrates a quantizer which carries out the quantization process of FIG. 5; and, FIG. 8 illustrates a quantizer which carries out the quantization process of FIG. 6.

Turning next to FIG. 7, it shows the overall architecture of an electronic circuit which performs the quantization process of FIG. 5. This circuit includes various modules which are numbered 50 thru 59. Module 50 is an electronic sensor which senses some particular type of physical phenomena and in turn produces an electrical output signal on a lead 50a which varies in accordance with that phenomena. For example, the sensor 50 may sense radar return pulses, or optical images, or infrared images, or audio signals or combinations thereof.

Module 51 is a sampler which periodically samples the sensor's output signal on lead 50a. Module 52 is a hold circuit which receives samples from the sampler 51 and temporarily stores them. Those samples in module 52 are selectively accessed and arranged in groups $V_i$ by module 53. Each group of samples $V_i$ is accessed in response to a control signal "START" from module 54, which is a sequential controller such as a microprocessor.

From module 53, each group of data samples is sent via a bus 53a to module 55. Module 55 is an arithmetic unit that performs a dot product operation. Module 55 has a second bus input 56a that comes from module 56, which is a memory. In memory 56, all of the reference groups of data samples $\bar{u}_l$ thru $\bar{u}_s$ are stored. Each reference group of data samples is selectively accessed by address signals A1 which come from the controller 54.

From module 55, the dot product results are sent via a bus 55a to module 57 also which is a compare circuit. At the same time, the compare circuit 57 also receives one of the constants $k_i$ from an output bus 58a of module 58. Module 58 is another memory, and each of the constants $k_i$ in memory 58 is selectively accessed via address signals A2 from controller 54.

Module 57 has an output 57a on which it generates a digital compare signal "C". This compare signal C is a "1" when the dot product on bus 55a is greater then or equal to the constant $k_i$ on bus 58a; otherwise the signal C is a "0". From module 57 the compare signal C is sent to module 59, which consists n flip-flops 59-1 thru 59-n. Each of those flip-flops is separately clocked (loaded) by controller 54.

In operation, the controller 54 begins by sending the START signal to module 53; and in response, module 53 sends a group of data samples on the output bus 53a to the dot product module 55. Then module 54 sends the A1 address to memory 56 which accesses one of the reference groups of data samples $\bar{u}_l$ thru $\bar{u}_s$, and module 54 sends the A2 address to memory 58 which accesses one of the constants $k_i$.

Modules 55 and 57 the perform their above described operations to produce a first compare signal C. That first compare signal is then clocked by the controller 54 into flip-flop 59-1. Based on the state of the compare signal in flip-flop 59-1, controller 54 then sends a new A1 address to memory 56 to select another reference group of data samples, and it send a new A2 address to memory 58 to select another constant $k_i$. This in turn produces a second compare signal C, which module 54 clocks into flip-flop 59-2.

Next, module 54 generates new A1 and A2 addresses, based on the preceding compare results in flip-flops 59-1 and 59-2. Thereafter, the third compare result is clocked into another flip-flop 59. This process continues until all of the flip-flops 59 have been loaded. When that occurs, the state of all of the flip-flops 59 form an index $I_l$ thru $I_n$ which identifies the centroid of the region 20 to which the input group of data samples $V_i$ is to be quantized.

Figure 8:
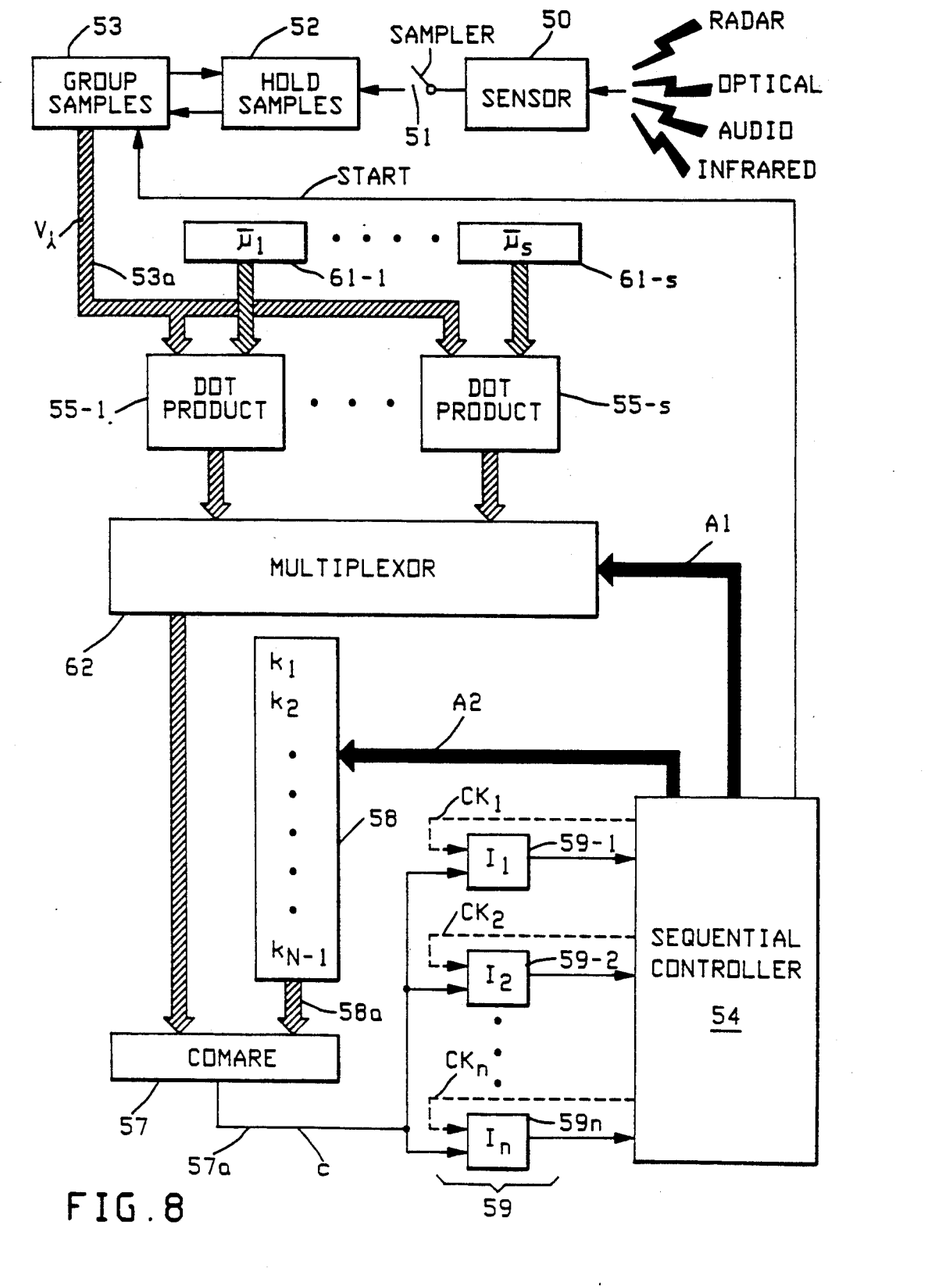

Reference should now be made to FIG. 8 which shows the overall architecture of an electronic circuit that performs the quantization process of FIG. 6. Some of the modules in the FIG. 8 circuit are the same as the modules in the FIG. 7 circuit; and they are identified by like reference numerals. These are modules 50, 51, 52, 53, 55, 57, 58, and 59. Note however that in the FIG. 8 circuit, the arithmetic module 55 is duplicated "s" times. Also in the FIG. 8 circuit, there are multiple registers 61-1 thru 61-s, each of which stores a respective one of the reference groups of data samples $\bar{u}_l$ thru $\bar{u}_s$. Further in the FIG. 8 circuit is a multiplexer 62.

In operation, all of the arithmetic modules 55-1 thru 55-S work in parallel. Each arithmetic module performs a dot product on the input group of data samples $V_i$ with a respective one of the reference groups of data samples $\bar{u}_l$ thru $\bar{u}_s$. All of the dot product results from the arithmetic modules are sent to multiplexor 62, and one of those results is sent via an output 62a to the compare module 57. Which particular dot product result gets passed thru the multiplexer 62 to the comparator 57 is selected by the A1 address from controller 54. Also, which constant $k_i$ gets sent to the compare module 57 is selected by the A2 address from controller 54.

Two preferred processes for quantizing groups of data samples in accordance with the invention have now been described in detail; and, two preferred electronic circuits for performing those quantization processes have also been described in detail. In addition however, various changes and modifications can be made to the details of these preferred processes and circuits without departing from the nature and spirit of the invention.

For example, in the quantization processes of FIG's. 5 and 6, there can be any number of nodes and any number of end branches. Also, in the FIG's. 5 and 6 processes, the shape of the tree can be symmetrical or unsymmetrical. Further in the FIG. 5 and 6 processes, the complexity of the dot products can be minimized by restricting each reference group of data samples $\bar{u}$ to have only one non-zero component. Such a restriction orients $\bar{u}_1$ on the $S_1$ axis, $\bar{u}_2$ on the $S_2$ axis, ... $\bar{u}_r$, on the $S_r$ axis; and, it reduces each dot product to just one multiplication. Further, in the quantization circuits of FIG's. 7 and 8, the total number of reference groups of data samples "s" can be extended all the way to N/2, and the amount of storage used would still be no more then half the storage that would otherwise be required if the boundaries of the regions 20 were unrestricted in their orientation.

Accordingly, it is to be understood that the invention is not limited to the details of the above described preferred processes and circuits, but is defined by the appended claims.

What is claimed is:

1. A sampled data quantizer for converting an input group of data samples, having substantially more than N possible values, to the centroid of one of N regions into which said values are divided—where N is a predetermined positive integer; said system comprising:

an input circuit for receiving said input group of data samples;

a storage means which stores multiple reference groups of data samples $\bar{u}$ and multiple constants k which respectively do not exceed N/2 and N-1, with each $\bar{u}$ and k being selected such that the product $\bar{u}k$ defines a vector which is orthogonal to and reaches a boundary between at least two of said N regions;

a control means, coupled to said storage means, which selects one of said reference groups of data samples $\bar{u}_x$ and one of said constants $k_y$;

an arithmetic means, coupled to said input circuit and said storage means, which performs a dot product on said input group of data samples with $\bar{u}_x$;

a comparing means, coupled to said arithmetic means, which compares the dot product result from said arithmetic means to $k_y$;

said control means being further coupled to said comparing means and adapted to repeatedly select a different $\bar{u}_x$ and $k_y$ for said arithmetic means and said comparing means, with each $\bar{u}_x$ and $k_y$ for being selected in accordance with a selection tree which has multiple nodes that are interconnected by branches—with each node specifying the $\bar{u}_x$ for said arithmetic means and the $k_y$ for said comparing means, and indicating which branch is taken based on the compare by said comparing means; and, a logic means, coupled to said comparing means, which identifies said centroid from each and every one of the compares by said comparing means.

2. A quantizer according to claim 1 wherein the total number of reference groups of data samples in said storage means is no more than $2 \log_2 N$.

3. A quantizer according to claim 1 wherein the total number of reference groups of data samples in said storage means is no more than 2r, where r is the number of samples in the input group of data samples.

4. A method of converting an input group of data samples, having substantially more than N possible values, to the centroid of one of N regions into which said values are divided—where N is a predetermined positive integer; said method including the steps of:

receiving said input group of data samples from an electronic input circuit;

storing in a storage means, multiple reference groups of data samples $\bar{u}$ and multiple constant k which respectively do not exceed N/2 and N-1, with each $\bar{u}$ and k being selected such that the product $\bar{u}k$ defines a vector which is orthogonal to and reaches a boundary between at least two of said N regions;

selecting from said storage means, one of said reference groups of data samples $\bar{u}_x$ and one of said constant $k_y$;

performing a dot product on said input group of data samples with $\bar{u}_x$;

comparing the dot product result obtained in said performing step to $k_y$;

repeating said selecting, performing, and comparing steps several times, with $\bar{u}_x$ and $k_y$ of each repetition being selected in accordance with a selection tree which has multiple nodes that are interconnected by branches—with each node specifying the $\bar{u}_x$ for said performing step and the $k_y$ for said comparing step and indicating which branch is taken based on the outcome of said comparing step; and, combining each and every one of the comparing step results to identify said centroid.

5. A method according to claim 4 wherein only one sample in each reference group of data samples has an non-zero magnitude.

6. A method according to claim 4 wherein each input group of data samples is a group of pixels.

7. A method according to claim 4 wherein each input group of data samples is a group of samples from a radar return signal.

8. A method according to claim 4 wherein each input group of data samples is a group of samples from an infrared signal.

9. A method according to claim 4 wherein each input group of data samples is a group of samples from an audio signal.

10. A method according to claim 4 wherein each input group of data samples contains a mix of samples from multiple frequency spectrums.

11. A method according to claim 4 wherein the total number of reference groups of data samples in said storage means is no more than $2 \log_2 N$.

12. A sampled data quantizer for converting an input group of data samples, having substantially more than N possible values, to the centroid of one of N regions into which said values are divided—where N is a predetermined positive integer; said system comprising:

an input circuit for receiving said input group of data samples;

a memory means which stores N-1 constants k;

a register means which stores no more than N/2 reference groups of data samples $\bar{u}$;

each $\bar{u}$ and k being selected such that the product $\bar{u}k$ defines a vector which is orthogonal to and reaches a boundary between at least two of said N regions;

an arithmetic means, coupled to said input circuit and said register means, which performs in parallel respective dot products on said input group of data samples with all of said reference groups of data samples $\bar{u}$;

a selecting means, coupled to said arithmetic means and said memory means, which selects the results $R_x$ of one of said dot products and one of said constants $k_y$;

a comparing means, coupled to said selecting means, which compares the selected dot product result $R_x$ to the selected constant $k_y$;

a control means, coupled to said selecting means, which repeatedly causes said selecting means to select a different $R_{x\ l\ and\ ky}$, with each $R_x$ and $k_y$ being selected in accordance with a selection tree which has multiple nodes that are interconnected by branches—with each node specifying the $R_x$ and $k_y$ for said selecting means, and indicating which branch is taken based on the compare by said comparing means; and, a logic means, coupled to said comparing means, which identifies said centroid from each and every one of the compares by said comparing means.

13. A quantizer according to claim 12 wherein the storage capacity of said register means is restricted to hold no more than $2 \log_2 N$ of said reference groups of data samples.

14. A quantizer according to claim 12 wherein the total number of reference groups of data samples in said register means is no more than 2r, when r is the number of samples in the input group of data samples and is at least two.

15. A method of converting an input group of data samples, having substantially more than N possible values, to the centroid of one of N regions into which said values are divided—where N is a predetermined positive integer; said method including the steps of:

receiving said input group of data samples from an electronic input circuit;

storing in a memory means N-1 constant k;

holding in a register means no more then N/2 reference groups of data samples $\bar{u}$;

each $\bar{u}$ and k being selected such that the product $\bar{u}k$ defines a vector which is orthogonal to and reaches a boundary between at least two of said N regions;

performing respective dot products on said received input group of data samples with all of said reference groups of data samples;

selecting the result $R_x$ of one of said dot products and selecting one of said constants $k_y$;

comparing the selected dot product result $R_x$ to the selected constant $k_y$;

repeating said selecting and comparing steps multiple times, with $R_x$ and $k_y$ of each repetition being selected in accordance with a selection tree which has multiple nodes that are interconnected by branches—with each node specifying the $R_x$ and $k_y$ for said selecting step, and indicating which branch is taken based on the compare by said comparing step; and, combining each and every one of the comparing step results to identify said centroid.

16. A method according to claim 15 wherein only one sample in each reference group of data samples has a non-zero magnitude.

17. A method according to claim 15 wherein each input group of data samples is a group of pixels.

18. A method according to claim 15 wherein each input group of data samples is a group of samples from a radar return signal.

19. A method according to claim 15 wherein each input group of data samples is a group of samples from an infrared signal.

20. A method according to claim 15 wherein each input group of data samples is a group of samples from an audio signal.

21. A method according to claim 15 wherein each input group of data samples contains a mix of samples from multiple frequency spectrums.

22. A method according to claim 15 wherein the total number reference groups of data samples in said storage means is no more than $2\log_2 N$.

* * * * *